United States Patent [19]
Chesnoy et al.

[11] Patent Number: 5,265,111
[45] Date of Patent: Nov. 23, 1993

[54] POSITIVE FEEDBACK DEVICE FOR PROCESSING AN OPTICAL SIGNAL

[75] Inventors: José Chesnoy, Paris; Jean-Michel Gabriagues, Le Val Saint Germain; Denis Leclerc, Bourg la Reine, all of France

[73] Assignee: Alcatel N.V., Amsterdam, Netherlands

[21] Appl. No.: 841,710

[22] Filed: Feb. 26, 1992

[30] Foreign Application Priority Data

Feb. 27, 1991 [FR] France .............................. 91 02351

[51] Int. Cl.$^5$ ........................................ H01S 3/10
[52] U.S. Cl. ............................. 372/32; 372/8; 372/29
[58] Field of Search ................ 372/29, 31, 32, 8

[56] References Cited
U.S. PATENT DOCUMENTS

| | | | |
|---|---|---|---|
| 3,427,563 | 2/1969 | Lasher | 372/8 |
| 4,932,034 | 6/1990 | Usami et al. | 372/46 |
| 5,056,100 | 10/1991 | Vahala et al. | 372/8 |

OTHER PUBLICATIONS

G. J. Lasher, "Analysis of a Proposed Bistable Injection laser", *Solid State Electronics* vol. 7 (1964), pp. 707–716, (no month listed).

K. Kondo et al, "Giga-bit Operation of Wavelength Conversion Laser". *Phototonic Switching 90 Conference Kobe Japan* (Apr. 1990), Paper 13D-9, pp. 199–201.

K. Okumura et al, "Optical logic inverter and AND elements using laser or light-emitting diodes and photodetectors in a bistable system", *Optics Letters* vol. 9, No. 11 (Nov. 1984), pp. 519–521.

*Primary Examiner*—James W. Davie
*Attorney, Agent, or Firm*—Robbins, Berliner & Carson

[57] ABSTRACT

A photodiode (26) receives an optical input signal (P1) and an internal optical signal (P2) and supplies in response thereto an internal electrical signal (I2), which in turn controls a laser (4) which effects amplification and supplies the internal optical signal and an output signal (P3). The feedback loop formed by this photodiode and laser leads to a strong non-linearity in the variation of the output signal as a function of the input signal. The invention is useful especially in optical fiber telecommunications systems.

9 Claims, 3 Drawing Sheets

POSITIVE FEEDBACK DEVICE FOR PROCESSING AN OPTICAL SIGNAL

BACKGROUND ART

Optoelectronics are playing an increasing role in optical fiber communications systems. However shaping, or more generally processing, optical signals has up to now only been realistically proposed through converting the optical signal into an electrical signal by a photo-detector. The electrical signal is then processed by an electronic system and reconverted to an optical signal by means of a semiconductor laser. Such processing is effected in particular in optical regenerators. The need to include optical elements (lasers, detectors) in association with electronic elements (transistors) in such processing devices restricts the possibilities for integration of these elements on a common substrate, of indium phosphide for example. Furthermore, the electronic amplifiers which are employed may give rise to restrictions on the pass band.

DISCLOSURE OF INVENTION

The present invention has in particular the following objects:

Simple implementation of a positive feedback device for processing an optical signal.

Facilitating the integration of the elements of such a device on a reduced number of substrates.

Avoiding as far as possible the use of electronic components that must operate at high frequencies.

Avoiding restriction of the pass band by such components.

In view of these objects the invention provides a positive feedback device for processing an optical signal, the device being characterized in that the gain of its feedback loop is introduced by means for increasing the gain, which means supply an amplified signal that is exclusively optical.

BRIEF DESCRIPTION OF DRAWINGS

A way in which the present invention may be implemented is described below with the aid of the accompanying schematic Figures, it being understood that the elements and devices described and shown are only by way of non-limiting example.

BEST MODE FOR CARRYING OUT THE INVENTION

The two devices given as examples are optical signal processing devices. The first of them includes a semiconductor laser oscillator with a saturable absorber. This oscillator will first be described in general terms, information on a like oscillator being found in a document by Lasher (G. J. LASHER. "Analysis of a proposed bistable injection laser", Solid State Electronics, Pergamon Press 1964, vol 7, p 707).

Figure 1:
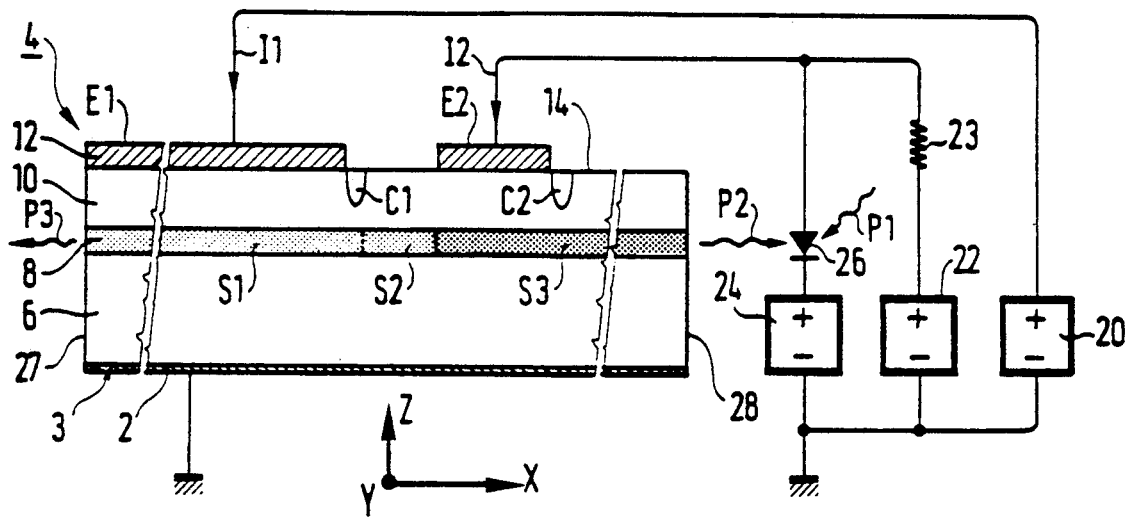
FIG. 1 is a view in longitudinal section of a first device including a laser oscillator and embodying the present invention.
Figure 2:
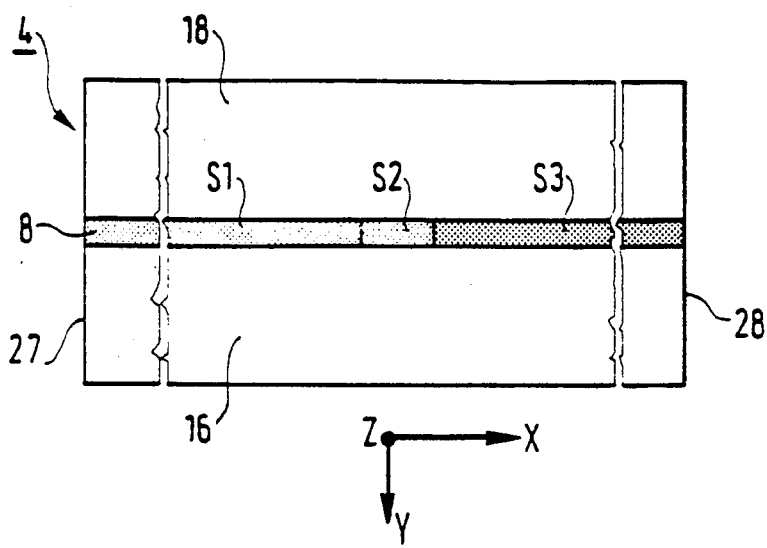
FIG. 2 is a view of a semiconductor wafer of this oscillator in section through a horizontal plane passing through a light guide layer of the laser.
Figure 3:
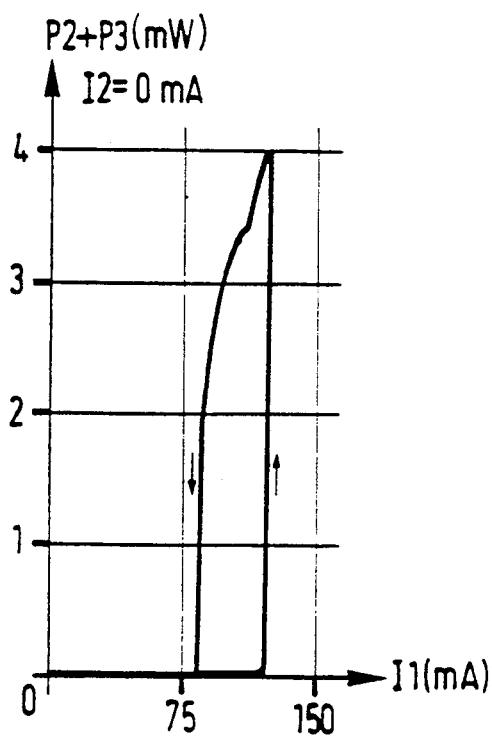
FIGS. 3 to 6 are graphs showing the variation in emitted optical power of this semiconductor wafer as a function of a power supply current injected into an amplifier of the wafer, for four values of an absorption control current injected into an absorber of the wafer.
Figure 4:
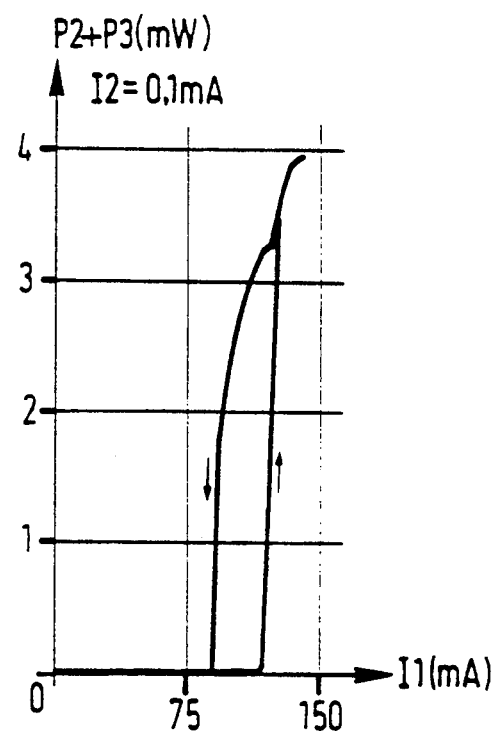
Figure 5:
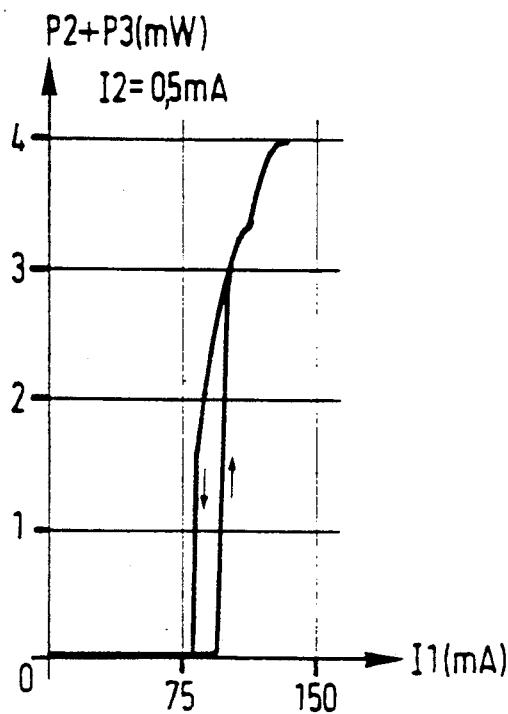
Figure 6:
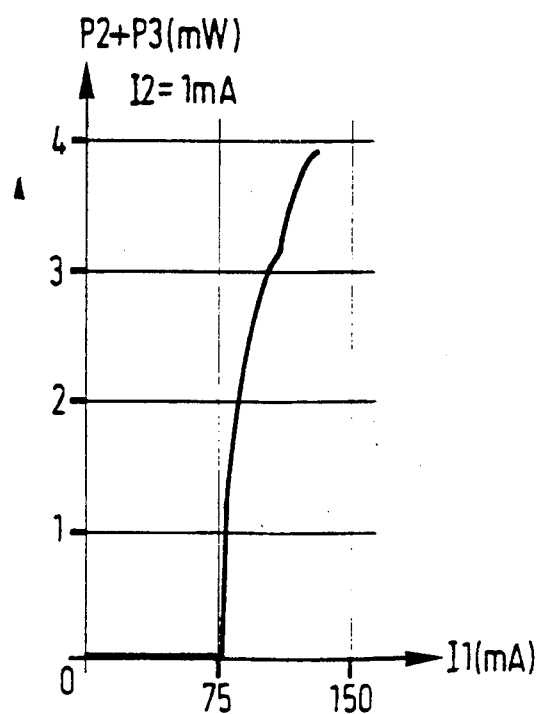

This laser oscillator shown in FIG. 1 and FIG. 2 comprises the following stack of layers, following each other in a vertical direction Z defined in relation to the stack:

a bottom electrode layer 2 on a bottom face of a semiconductor wafer 4, a lower confining layer 6 pertaining to the semiconductor wafer and having a first electrical conductivity type and a refractive index, a light guide layer 8 comprising a light guide S1, S2, S3 formed at least partially of a semiconductor material in crystalline continuity with the lower confining layer and having a refractive index greater than that of the lower confining layer to effect vertical optical confinement within this guide layer, an upper confining layer 10 pertaining to said semiconductor wafer and having crystalline continuity with the light guide, a second electrical conductivity type and a refractive index lower than that of the light guide, to effect said vertical optical confinement, and a top electrode layer 12 on a top face 14 of said semiconductor wafer.

The light guide S1, S2, S3 extends in a longitudinal direction X in the light guide layer between two lateral confining regions 16, 18. The refractive indices of these two regions are selected to be lower than that of the guide to effect transverse optical confinement, confining light in the guide between these two lateral confining regions. The guide comprises a back to front sequence of sections along the longitudinal direction as follows: A first section is a light amplifier S1. A second section is a saturable absorber S2 and forms an active unit S1, S2 with the amplifier. The active unit is constituted by an active semiconductor material selected to act on emission light which is propagated at an emission wavelength in the longitudinal direction. This material is adapted to be traversed by electrical currents passing between the upper and lower confining layers, the currents being measured algebraically in a forwards direction defined by the conductivity types of these two layers. The material amplifies the light in the amplifier when an electrical current flowing through the amplifier has a current density above a threshold of amplification. This current thus forms a power supply current I1. The material absorbs the light in the absorber when the electrical current flowing in the absorber has a current density below the threshold of amplification. This current thus forms an absorbance control current I2. The absorber absorbs fresh energy from the light only to the extent that the light energy which has already been absorbed and accumulated during an energy storage interval is lower than its absorbance, this energy storage interval having a limited duration and preceding and including the instant at which the absorber receives the fresh energy. The absorbance is controlled by the control current.

The upper electrode layer comprises:

a power supply electrode E1 disposed to transmit the power supply current I1 towards the bottom electrode layer 2 through the amplifier S1, and an absorbance control electrode E2 disposed to transmit the absorbance control current I2 towards the bottom electrode layer through the absorber S2.

The laser of FIG. 1 further comprises:

a power supply source 20 to provide the power supply current to the power supply electrode, and an absorbance control source 22, 23, 24, 26 to supply the absorption control current to the control electrode E2.

Light reflecting means 27, 28 are located at both ends of the active unit S1, S2 to form a laser oscillator emitting said emission light. They are constituted in the device shown by way of example by the rear and front faces 27 and 28 of the wafer 4, these faces being partially reflecting to form a Fabry-Perot resonator. They could also be constituted by external mirrors or by a distributed Bragg reflector inside the wafer.

In conventional manner the power supply and absorbance-control electrodes E1 and E2 are in the form of strips having lengths in a transverse direction Y greater than the width of the light guide S1, S2, S3, electrical lateral confining means being provided to prevent at least partially said power supply and absorption control currents I1 and I2 passing though said lateral confining layers 16, 18. These electrical confining means may in particular be formed by a suitable internal composition or structure of these confining regions.

In a design whose advantages appear below, the light guide S1, S2, S3 comprises a third section within the semiconductor wafer 4 and in front of the absorber S2, being formed from a passive material selected to transmit said emission light without appreciably affecting either its intensity or its speed of propagation. This section forms a passive section S3.

The guide may be simple, each of its sections being geometrically continuous with the preceding sections. The coupling between sections is then longitudinal. The guide may also be composite, being formed for example by two superimposed layers. The coupling between the absorber and the passive section may then be a vertical coupling mutually coupling the two layers.

Moreover the guide may comprise other sections which may be for example a phase shift section and a frequency tuning section, such as are described for making a frequency controlled laser in a document by Kondo (K. KONDO; H. NOBUHARA; S. YAMAKOSHI. "Giga-bit operation of wavelength conversion laser". Paper 13D-9, "Photonic Switching 90" Conference, Apr. 12-14, 1990, KOBE, Japan).

Moreover some components not shown may be integrated into the semiconductor wafer. These may be especially a photodiode pertaining to the absorbance control source or an extra light amplifier outside the resonant cavity of the laser oscillator.

In another advantageous design which is made possible by the presence of the passive section S3, the absorbance control electrode E2 extends at least partially over this section. This design allows this electrode to have a dimension in the longitudinal direction greater than the length of the absorber. If, as is often the case, this length is smaller than the width of a metal strip which can be made easily to implement this electrode, this design makes for easy implementation of this electrode. At the same time it allows an absorber to be implemented which is shorter than the width of this electrode, which allows the laser to respond rapidly to variations in the absorbance control current.

The wafer 4 has a front cleavage face 28 forming a front end of the passive section S3. This face of the wafer is formed, like its rear face 27 by a conventional cleavage operation, which is known to involve a lack of accuracy in the position of the face thus formed. Because of the presence of this section, the lack of accuracy is acceptable since it affects only the length of this section, while, in the absence of the passive section, the lack of accuracy would affect the length of the absorber, which would prevent a high speed of response of the laser to the absorbance control current being obtained in a reproducible manner.

In another advantageous design, the amplifier S1 and the absorber S2 are connected optically to an optical component 26 though the passive section S3. This design facilitates implementation of an optical circuit including the wafer 4 and this component which, for example, is a photodiode 26 constituting a light receiver and forming part of the absorbance control source 22, 23, 24, 26.

Electrically insulating channels are formed in the semiconductor wafer from its top face 14. A rear insulating channel C1 is located longitudinally between the power supply electrode E1 and the absorber S2. A front insulating channel C2 is located longitudinally in the vicinity of the front edge of the control electrode E2 and it forms a barrier to electrical current in paths leaving the absorbance control electrode E2 for the bottom electrode layer 2 and passing through the passive section S3. The presence of such a barrier makes efficient control possible using an absorbance control source supplying a relatively weak current, because a relatively large active fraction of the current passes through the absorber, while the condition to be fulfilled in relation to this current in order to achieve efficient control is that its active fraction is sufficient.

The laser oscillator whose various features have been described emits said emission light in the form of a beam P3, in response to an input signal that is electrical, such as the absorbance control current I2. In contrast to this, the optical signal processing device which includes this oscillator emits the light in response to an input signal that is optical. This input signal is formed by a light beam P1 received by the photodiode 26 which constitutes a light receiver included in the absorbance control source. This beam controls a current passing through the photodiode and which forms in part the absorbance control current I2. It thus controls an output signal that is optical, as constituted by the beam P3.

There is now be described in a general manner some features which are adopted in the processing devices according to the present invention and which are in common with a prior processing device so far as the indicated functions are concerned. The prior device is described in a document by Okumura (K. OKUMURA, Y. OGAWA, H. ITO and H. INABA. Optics Letters, 9, p. 519 (1984)).

The first processing device given by way of example comprises the following elements shown in FIG. 1, as said common fatures:

a light receiver 26 for receiving firstly an input signal P1 that is optical and secondly an internal optical signal P2 and for supplying an internal electrical signal I2 in response to the combination of these two signals, and a light emitter 4 responsive to the internal electrical signal to supply firstly said internal optical signal to form a feedback loop and secondly an output signal P3 that is optical.

This loop has a loop gain which is an open loop differential gain and which varies as a function of said optical and electrical internal signals. This variation exhibits a maximum loop gain for two non-zero respective values of the two signals.

Means for increasing the gain are included in this loop to increase at least this maximum value of the loop gain and to make it preferably greater than 0.9.

Figure 7:
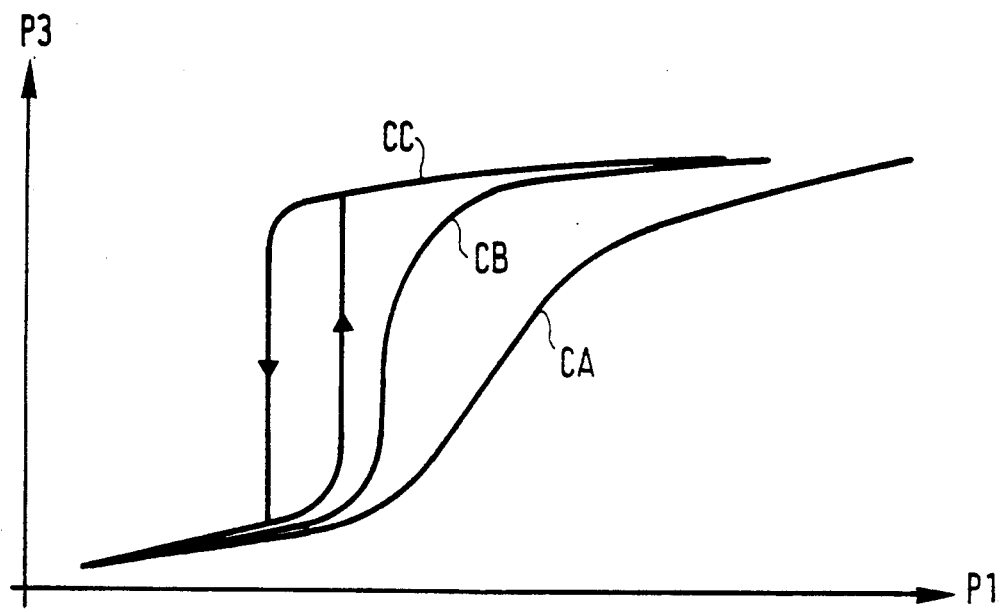
FIG. 7 is a graph showing the variation of an output signal as a function of an input signal of the device, for three values of mean gain of a feedback loop formed by the device.

The presence of a feedback loop with a gain which thus approaches or exceeds unity makes it possible to vary the differential gain of the device, i.e. the ratio of variation of the output signal P3 to that of the input signal P1, much more than the variation in the loop gain. The variation in the strength of the output signal P3 of such a device as a function of the variation of the input signal P1 is illustrated in FIG. 7 by three "characteristic" curves CA, CB and CC, corresponding respectively to values of the loop gain G being less than, equal to, and greater than unity.

In the case of a gain a little less than or equal to unity, the characteristic curve of the device has the shape of an S. In the case of a loop gain greater than unity it exhibits a hysteresis loop, i.e. a bistable characteristic.

Such characteristic curves make it possible for the shape of an initially rectangular pulse to be restored after it has been distorted during the course of transmission. Of course an overall gain of the processing device much greater than the loop gain can be selected if it is desired to obtain an output signal of substantially greater power than that of the input signal.

In addition to these features in common, the present invention makes it possible to adopt various advantageous designs which will now be described in a general manner.

In one such advantageous design which is adopted in the two devices given by way of example and which has been described with the aid of FIG. 1, the internal electrical signal I2 is applied without amplification to the light emitter 4 and said means for increasing the gain is means associated at least with this emitter to control the internal optical signal P2 which is received by the light receiver 26.

In another advantageous design which is adopted in the first device given by way of example, this means for increasing the gain comprises a saturable absorber S2 whose absorbance is controlled by said internal electrical signal I2 and decreases when this signal increases, the variation in the absorbance as a function of this signal effecting an increase in the loop gain when the signal increases to a non-linear region of the device.

In another advantageous design, the saturable absorber S2 and a light amplifier S1 are included in a resonant optical cavity 27, 28 to form a laser oscillator constituting said light emitter 4. These designs have the advantage that the internal electrical signal current supplied by the light receiver can be very small. This smallness facilitates implementation of the device. On the other hand it allows use of a receiver 26 with a rapid response, such as a reverse-biased PIN type photodiode. It is possible to reverse bias the photodiode, without risk of the wafer 4 deteriorating, because the current I2 flows in the forwards direction. The bias is realized by a potential source 24 for example. The current I2 is formed by the sum of the current passing through the photodiode and a pre-bias current supplied through a resistance 23 by another potential source 22. These two potential sources and the photodiode together constitute the absorbance control source.

This absorber is for example the absorber S2 of the laser oscillator previously described.

In another advantageous design which has already been seen above in relation to this oscillator, the absorber S2 and the light amplifier S1 form two longitudinally successive sections of a light guide S1, S2, S3 formed in a semiconductor wafer 4, which forms said light emitter and within which the amplifier receives a power supply current I1 supplied by a source of power supply 20 which is at least partially independent of the internal optical signal P2.

Moreover it may be advantageous for the emission wavelength, i.e. the emission in wavelength of the output signal P3, to be controlled. This could be effected for example by means of a distributed Bragg reflector which would be formed in a frequency control section of the light guide and which would be associated with a phase adjusting section, the refractive indices of these two sections being controlled in known manner by electrical currents injecting charge carriers into these sections.

The emission wavelength may moreover with advantage be different from that of the input signal P1. This design provides optical decoupling between the laser formed by the wafer 4 and a preceding optical source, not shown, supplying the input signal formed by the beam P1. This decoupling eliminates any parasitic optical feedback interference with the preceding source.

Various particulars of the elements referred to above will now be presented in more detail.

The wafer 4 has been made from an n-doped indium phosphide InP substrate epitaxially doped in liquid phase. The active (sections S1 and S2) and passive (section S3) materials employed will be called type 1 and type 2 below. They are quaternary alloys that are not intentionally doped. They are of the type $In_{1-x}Ga_x$-$As_yP_{1-y}$ formed from indium, gallium, arsenic and phosphorus and match the lattice of the substrate. These materials have respective forbidden bands corresponding to wavelengths of 1,530 nm and 1,300 nm. The first of these wavelengths forms said emission wavelength. The confining materials, i.e. those of the confining layers, are the n-doped InP substrate for the lower confining layer 6 and a p-doped InP epitaxial layer for the top confining layer 10. An epitaxial contact layer is not shown. Its thickness is 200 nm. It is formed by a heavily p-doped quaternary contact material of type 2. Such a layer is present under the electrodes E1 and E2.

The wafer 4 has been made according to the recited indium phosphide technology, but its principle of implementation may be transferred to any other system of semiconductor materials, such as gallium arsenide (GaAs) technology. The type 1 and type 2 materials may equally be replaced by more complex structures such as super-lattice structures with multiple quantum wells, or a stack of layers of different doped or undoped materials. It is sufficient if the structure replacing the material 1 has optical gain at the desired emission wavelength and that the structure replacing the type 2 material is transparent at this same wavelength.

The active and passive materials should be surrounded on both sides by confining materials likewise transparent to the emission wavelength, in order to form a single mode waveguide. A material will be called transparent if its absorption per unit length is less than 50 cm$^{-1}$. The various elements of the wafer 4 may be more specifically as follows:

The amplifier S1 and absorber S2 are made of type 1 material, called active, and exhibiting a maximum optical gain at the emission wavelength and unintentionally n-type doped to $10^{17}$ cm$^{-3}$.

The passive section S3 is made of type 2 material, called passive, transparent at the emission wavelength, exhibiting a maximum optical gain at the wavelength of 1,300 nm, n-type doped to $5;10^{17}$ cm$^{-3}$.

The upper confining layer 10 is of p-type InP doped to a concentration in the range $10^{17}$ cm$^{-3}$ to $2;10^{18}$ cm$^{-3}$, typically over 1000 nm thick.

The lower confining layer 6 is of n-type InP doped to a concentration in the range $10^{17}$ cm$^{-3}$ to $5;10^{18}$ cm$^{-3}$, typically over 1000 nm thick.

The absorber S2 is not powered directly by the electrode E1. It has a saturable absorbance at the emission wavelength. Its length may vary typically between 0.005 mm and 0.025 mm. Its implemented length is for example 0.01 mm.

The size of the electrode E1 in said longitudinal direction may lie typically in the range 0.1 mm to 0.6 mm, for example 0.4 mm.

The absorbance control electrode E2 is typically located near the transition between the active and passive materials (at a distance less than 0.001 mm) and thus near the saturable absorber. Its size in the X direction may lie in the range 0.001 mm to 0.1 mm. It directly determines the value of the control current I2. It is advantageous to make this electrode as narrow as possible, an implemented value being 0.085 mm.

The insulating channels C1 and C2 are sunk into the contact material (not shown) and the upper confining layer 10 in order to define the resistance values between sections or between electrodes. These channels may typically have a width of 0.005 mm and a depth equal to ¾ the total thickness of the contact material and the material of the upper confining layer.

The electrical resistance between the power supply electrode E1 and the saturable absorber S2 may lie in the range 100 ohms to 10,000 ohms. Values in the range 200 ohms to 1,400 have been tested.

The electrical resistance between the control electrode E2 and the saturable absorber S2 has been tested with a value of 20 ohms.

FIGS. 3, 4, 5 and 6 show the behavior of the laser implemented as described above for four values of the control current I2, namely 0 mA, 0.1 mA, 0.5 mA and 1 mA respectively. They show the hysteresis loop of emitted optical power (as ordinate) as a function of current (as abscissa) injected into the laser through the power supply electrode E1.

It is remarkable that a current I2 as low as 0.1 mA enables the absorbance of the saturable absorber to be controlled. A complete closure of the hysteresis loop is obtained with a change of I2 less than 1 mA. An increase in I2 mainly reduces the value of the current I1 which causes the light emission but it is important to note that the value of the current I1 causing extinction is likewise reduced.

An important consideration in the present invention lies in that the size of the hysteresis loop of a bistable semiconductor laser can be controlled by very weak control currents, typically less than a milliamp, and that this control is effected by forward biasing of the semiconductor junction which receives the current within the laser. This makes it possible to realize more easily a signal processing device in which the internal electrical signal I2 is supplied by a reverse-biased photodiode, such as 26.

Figure 8:
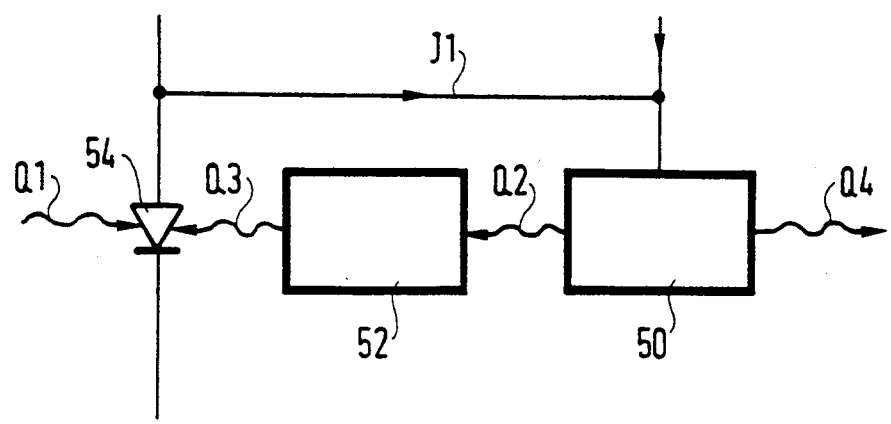
FIG. 8 is a block diagram of a second device embodying the present invention.

An advantageous alternative design, which is adopted in the second device given by way of example, is now described with reference to FIG. 8.

In this design, said light emitter is constituted by a laser oscillator 50 which is powered by said internal electrical signal, here formed by a signal J1, which supplies the internal optical signal, formed by a signal Q2, with an output level always below said maximum value of the loop gain. Said means for increasing the gain is then formed by a light amplifier. This constitutes a feedback amplifier 52 external to the laser oscillator 50. It receives the internal optical signal at the output of the laser oscillator, amplifies it and transmits in response thereto an amplified internal optical signal Q3 to said light receiver, which is here a receiver 54.

Said input and output signals of the device are represented Q1 and Q4 respectively.

In the case of this design, the laser oscillator may be of the distributed feedback (DFB) type and it may be integrated within a semiconductor wafer with the feedback amplifier and possibly with the light receiver.

We claim:

1. An electrooptical device including a positive feedback loop for conditioning an input optical signal, said positive feedback loop having an associated loop gain and comprising:
   light receiver means responsive to the input optical signal and to an internal optical signal for producing an unamplified internal electrical signal;
   light emitting means having an input directly coupled to the unamplified internal electrical signal for producing the internal optical signal; and
   loop gain means associated with the light emitting means for increasing the loop gain associated with the feedback loop to a maximum value greater than unity such that the power of the internal optical signal increases at a faster rate than the power of the internal electrical signal.

2. A device according to claim 1, wherein:
   said light receiver means is a light receiver for receiving firstly the input optical signal and secondly the internal optical signal, and for supplying the internal electrical signal in response to the combination of these two optical signals;
   said light emitting means is a light emitter having an associated emission wavelength and is controlled by said unamplified internal electrical signal to supply firstly said internal optical signal and secondly an output optical signal;
   said internal optical signal and said output optical signal are each constituted by emission light having said associated emission wavelength;
   said loop gain is an open loop differential gain which varies as a function of said internal optical signal and said internal electrical signal, this variation exhibiting a maximum value of said loop gain for a combination of two respective non-zero values of the two internal signals; and
   said loop gain means increases at least said maximum value of the loop gain.

3. A device according to claim 2, wherein
   said loop gain means comprises a saturable absorber adapted to absorb light energy at the instant it receives such energy;
   said absorber absorbs the light energy only while the amount of light energy which it has absorbed and accumulated during an energy storage interval is less than a controlled absorbance of the absorber, the energy storage interval preceding and including the current instant and having a limited duration, the absorbance being controlled by the internal electrical signal and decreasing as the internal electrical signal increases; and the variation in the absorbance as a function of the internal electrical signal causes an increase in the loop gain when the signal increases to a non-linear region of the device.

4. A device according to claim 3, wherein said saturable absorber and a light amplifier are included in a resonant optical cavity to form a laser oscillator constituting said light emitter.

5. A device according to claim 4, wherein said absorber and light amplifier form two longitudinally successive sections of a light guide formed in a semiconductor wafer which forms said light emitter and within which the amplifier receives a power supply current supplied by a source a power supply which is at least partially independent of said internal optical signal.

6. A device according to claim 2, wherein
said light emitter is formed by a laser oscillator controlled by said internal electrical signal, said laser oscillator supplying said internal optical signal at an unamplified output level always below said maximum value of the loop gain, and said means for increasing the gain is formed by a light amplifier which functions as a feedback amplifier and which is external to the laser oscillator, the amplifier receiving the unamplified internal optical signal at the output of the laser oscillator and, in response thereto, transmitting an amplified internal optical signal to said light receiver.

7. A device according to claim 2, wherein said light receiver is a reverse biased fast-acting PIN photodiode.

8. A device according to claim 2, wherein said emission wavelength is controlled.

9. A device according to claim 2, wherein said emission wavelength is different from the wavelength of said input signal.

* * * * *